United States Patent
Chih et al.

(10) Patent No.: US 10,643,722 B2
(45) Date of Patent: May 5, 2020

(54) MEMORY DEVICE

(71) Applicant: Taiwan Semiconductor Manufacturing Co., Ltd., Hsin-Chu (TW)

(72) Inventors: Yu-Der Chih, Hsin-Chu (TW); Chien-Yin Liu, Hsinchu (TW); Yi-Chun Shih, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

(21) Appl. No.: 16/159,214

(22) Filed: Oct. 12, 2018

(65) Prior Publication Data

US 2019/0221276 A1     Jul. 18, 2019

Related U.S. Application Data

(60) Provisional application No. 62/616,985, filed on Jan. 12, 2018.

(51) Int. Cl.
    *G11C 16/34*        (2006.01)
    *G11C 16/10*        (2006.01)
    *G11C 16/26*        (2006.01)

(52) U.S. Cl.
CPC ......... *G11C 16/3459* (2013.01); *G11C 16/10* (2013.01); *G11C 16/26* (2013.01)

(58) Field of Classification Search
CPC ...... G11C 16/3459; G11C 16/10; G11C 16/26
See application file for complete search history.

(56) References Cited

U.S. PATENT DOCUMENTS

| | | | | |
|---|---|---|---|---|
| 8,397,024 | B2 * | 3/2013 | Fasoli | G06F 12/0246 711/103 |
| 9,110,829 | B2 * | 8/2015 | Chih | G06F 11/1004 |
| 9,484,114 | B1 * | 11/2016 | Ben-Rubi | G11C 29/04 |
| 9,552,244 | B2 * | 1/2017 | Kim | H03M 13/05 |
| 2015/0113207 | A1 * | 4/2015 | Shin | G06F 12/0246 711/103 |
| 2016/0078946 | A1 * | 3/2016 | Byun | G11C 16/10 365/185.12 |
| 2017/0206124 | A1 * | 7/2017 | Lim | G06F 11/0727 |

* cited by examiner

*Primary Examiner* — Tri M Hoang
(74) *Attorney, Agent, or Firm* — Duane Morris LLP

(57) ABSTRACT

A circuit includes: writing a plurality of data words, each of which has a plurality of data bits, into respective bit cells of a memory device; in response to determining that not all the data bits of the plurality of data words are correctly written into the respective bit cells of the memory device, grouping the plurality of data words as a plurality of data word sets; and simultaneously rewriting a subset of data bits that were not correctly written into the respective bit cells of the memory device, wherein the subset of the data bits are contained in a respective one of the plurality of data word sets.

20 Claims, 5 Drawing Sheets

MEMORY DEVICE

CROSS-REFERENCE TO RELATED APPLICATION

The present application claims priority to U.S. Provisional Patent Application No. 62/616,985, filed on Jan. 12, 2018, which is incorporated by reference herein in its entirety.

BACKGROUND

Memory devices are commonly employed in many types of electronic devices, such as computers, cell phones, tablets, data loggers, and navigational equipment, just to name a few examples. In general, write operations may be used to store information as data bits in such a memory device. In some instances, there may be plural data words, each of which includes plural data bits, which are configured to be written into respective memory bit cells of the memory device. Occasionally, respective write operations may fail. For example, one or more data bits of the plural data words may not be correctly written to the configured memory bit cells. Such data bits are typically referred to as failed data bits.

To remedy such failed data bits, techniques used in existing memory devices typically rely on one or more iterations to rewrite the failed data bits based on a unit of a single "word." For example, the failed data bits contained in a first word are rewritten into the respectively configured memory bit cells, the failed data bits contained in a second word are rewritten into the respectively configured memory bit cells, and so on, which is time and power consuming. Thus, existing memory devices and methods to store data bits are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a memory device including a control logic circuit that is configured to rewrite one or more failed data bits into respectively configured memory bit cells based on a unit of data word group. In some embodiments, the control logic circuit may initiate a grouping operation on a plurality of data words, each of which includes a plurality of data bits, in response to determining a presence of one or more failed data bits within such a plurality data words. For example, the control logic circuit is configured to group the plurality of data words, which have a first number of data words, as a plurality of data word sets, which have a second number of data word sets, wherein the second number is less than the first number. According to some embodiments, the control logic circuit iteratively checks whether each of the data word sets contains any of the failed data bits, and if so, rewrites the failed data bit(s) into the configured memory bit cells.

In some embodiments, by rewriting the failed data bit(s) based on the unit of data word set instead of each single word, various advantages may be provided. For example, since in general, the number of failed data bits compared to the total number of data bits of each word is relatively low (e.g., about in the range of one part per million (ppm)), rewriting the failed data bits grouped in each data word set can be more efficient in terms of time and power. Further, because of the more efficient rewrite operation(s), a greater tolerance on errors is allowed for the initial write operation. As such, the magnitude of an initial write signal applied to the memory bit cells of the disclosed memory device can be substantially reduced, which may advantageously improve respective endurances of the memory bit cells.

Figure 1:
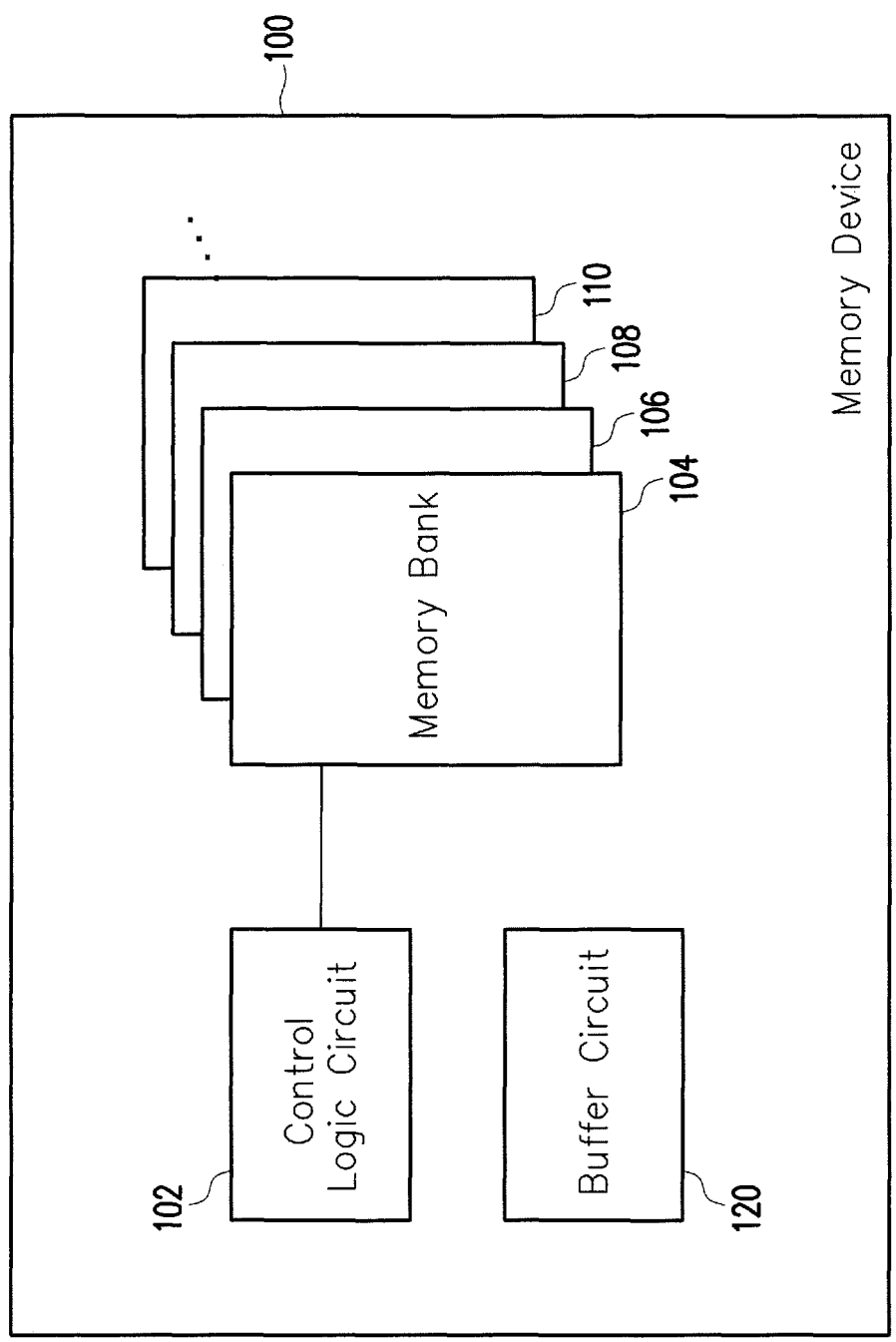
FIG. 1 illustrates an exemplary block diagram of a memory device, in accordance with some embodiments.

FIG. 1 illustrates a block diagram of an exemplary memory device 100, in accordance with various embodiments of the present disclosure. As shown, the memory device 100 includes a control logic circuit 102, a plurality of memory banks 104, 106, 108, and 110, and a buffer circuit 120. Although as shown in the illustrated embodiment of FIG. 1, the memory device 100 includes four memory banks 104 to 110, it is understood that the memory device 100 can include any desired number of memory banks while still remaining within the scope of the present disclosure.

In some embodiments, the control logic circuit 102, coupled to the memory banks 104 to 110, is configured to receive a plurality of data words, each of which includes a plurality of data bits, though a standardized interface (not shown), and write such a plurality of data words into respective memory bit cells of the memory banks 104 to 110. Further, when receiving the plurality of data words, the control logic circuit 102 may also receive respective logical addresses of the data bits of the plurality of data words. Based on the logical addresses, the control logic circuit 102 may write each of the data bits of the plurality of data words into the respective memory bit cell across the memory banks 104 to 110 (i.e., writing the data bits of the plurality of data words into respective physical addresses). When one or more of the data bits are not correctly written into the respective memory bit cells at such configured addresses (hereinafter "failed data bits"), the control logic circuit 102 may perform a grouping operation to rewrite the one or more failed data bits into the respective memory bit cells using a unit of data word group, as will be discussed in further detail below.

In some embodiments, the buffer circuit 120, typically referred to as a cache memory, is coupled to the control logic circuit 102 and includes a plurality of non-volatile memory cells such as, for example, flash memory cells, chalcogenide random access memory (C-RAM) cells, phase change RAM (PC-RAM or PRAM) cells, programmable metallization cell RAM (PMC-RAM or PMCm) cells, ovonic unified memory (OUM) cells, resistance RAM (RRAM) cells, ferroelectric memory (FeRAM) cells, etc., or volatile memory cells, for example, static RAM (SRAM) cells, dynamic RAM (DRAM) cells, etc. Such memory cells of the buffer circuits 120 may be formed as on-chip memory cells (i.e., formed on the same chip as memory banks 104-110) or off-chip memory cells (i.e., formed on a different chip from memory banks 104-110). In some embodiments, the control logic circuit 102 may store various types of data in the buffer circuit 120, for example, a mapping of the above-mentioned failed data bits, as will be discussed below.

Figure 2A:
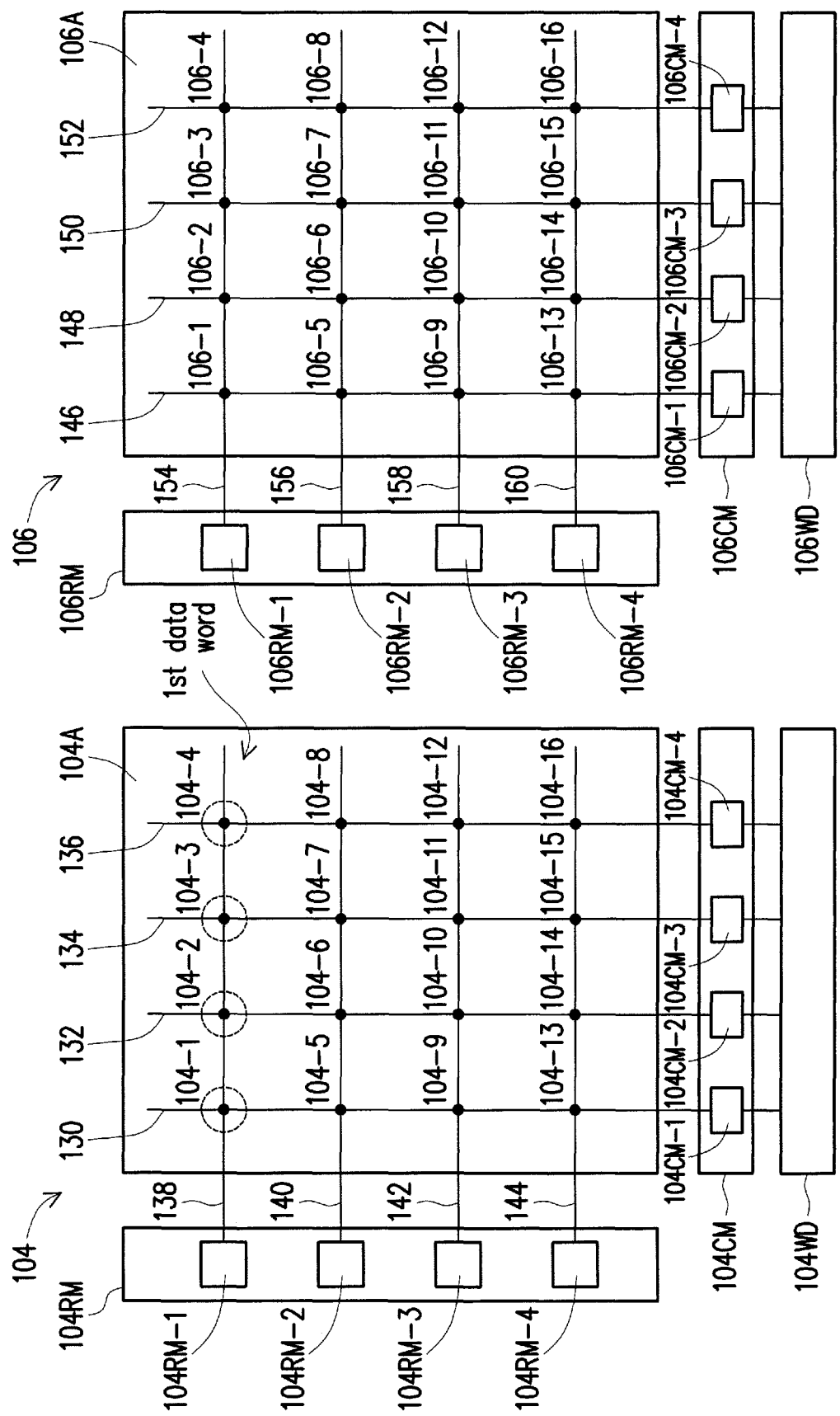
FIG. 2A illustrates an exemplary schematic diagram of a portion of the memory device of FIG. 1, in accordance with some embodiments.
Figure 2B:
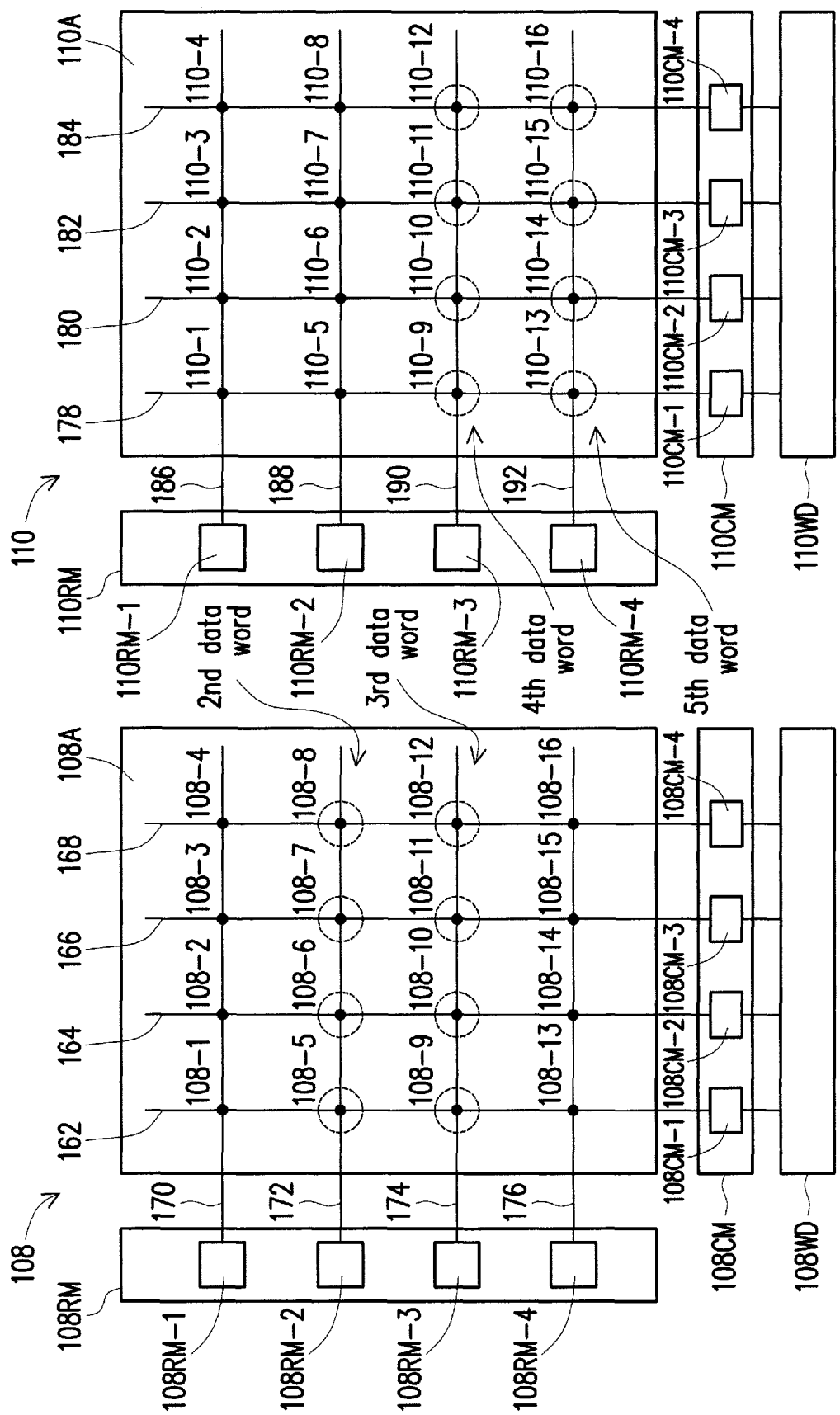
FIG. 2B illustrates an exemplary schematic diagram of another portion of the memory device of FIG. 1, in accordance with some embodiments.

As mentioned above, each of the memory banks 104 to 110 includes a respective plurality of memory bit cells. In some embodiments, the respective plurality of memory bit cells are arranged in a column-row configuration, wherein each memory bit cell is disposed at a respective intersection of a bit line (BL) that forms a column and a word line (WL) that forms a row. Further, each of the memory banks 104 to 110 includes a respective row selection circuit, a column selection circuit, and a write driver. FIGS. 2A and 2B illustrate respective schematic diagrams of the memory banks 104 to 110, according to some embodiments.

Referring to FIG. 2A, the schematic diagrams of the memory banks 104 and 106 are shown, respectively. The memory bank 104 includes memory bit cells 104-1, 104-2, 104-3, 104-4, 104-5, 104-6, 104-7, 104-8, 104-9, 104-10, 104-11, 104-12, 104-13, 104-14, 104-15, and 104-16 that are formed as an array 104A, a row selection circuit (typically referred to as a row multiplexer circuit) 104RM, a column selection circuit (typically referred to as a column multiplexer circuit) 104CM, and a write driver circuit 104WD. As will be discussed below, each of the row selection circuit 104RM, and the column selection circuit 104CM includes a plurality of components that are coupled to corresponding memory bit cells through respective BL's or WL's. Although in the illustrated embodiment of FIG. 2A, the memory bank 104 has 16 memory bit cells, the memory array 104A of the memory bank 104 can have any desired number of memory bit cells while remaining within the scope of the present disclosure. Further, it is understood that FIG. 2A illustrates only an exemplary embodiment and the memory bank 102 can utilize other memory circuits known in the art, e.g., sensing amplifiers, pre-charging circuits, etc., while remaining within the scope of the present disclosure.

As shown, the memory bit cell 104-1 is disposed at an intersection of BL 130 arranged along a first column and WL 138 arranged along a first row, the memory bit cell 104-2 is disposed at an intersection of BL 132 arranged along a second column and the WL 138 arranged along the first row, the memory bit cell 104-3 is disposed at an intersection of BL 134 arranged along a third column and the WL 138 arranged along the first row, the memory bit cell 104-4 is disposed at an intersection of BL 136 arranged along a fourth column and the WL 138 arranged along the first row, the memory bit cell 104-5 is disposed at an intersection of the BL 130 arranged along the first column and WL 140 arranged along a second row, the memory bit cell 104-6 is disposed at an intersection of the BL 132 arranged along the second column and the WL 140 arranged along the second row, the memory bit cell 104-7 is disposed at an intersection of the BL 134 arranged along the third column and the WL 140 arranged along the second row, the memory bit cell 104-8 is disposed at an intersection of the BL 136 arranged along the fourth column and the WL 140 arranged along the second row, the memory bit cell 104-9 is disposed at an intersection of the BL 130 arranged along the first column and WL 142 arranged along a third row, the memory bit cell 104-10 is disposed at an intersection of the BL 132 arranged along the second column and the WL 142 arranged along the third row, the memory bit cell 104-11 is disposed at an intersection of the BL 134 arranged along the third column and the WL 142 arranged along the third row, the memory bit cell 104-12 is disposed at an intersection of the BL 136 arranged along the fourth column and the WL 142 arranged along the third row, the memory bit cell 104-13 is disposed at an intersection of the BL 130 arranged along the first column and WL 144 arranged along a fourth row, the memory bit cell 104-14 is disposed at an intersection of the BL 132 arranged along the second column and the WL 144 arranged along the fourth row, the memory bit cell 104-15 is disposed at an intersection of the BL 134 arranged along the third column and the WL 144 arranged along the fourth row, the memory bit cell 104-16 is disposed at an intersection of the BL 136 arranged along the fourth column and the WL 144 arranged along the fourth row.

Along the first row of the memory array 104A, the memory bit cells 104-1 to 104-4 are coupled to a first component 104RM-1 of the row selection circuit 104RM through the WL 138; along the second row of the memory array 104A, the memory bit cells 104-5 to 104-8 are coupled to a second component 104RM-2 of the row selection circuit 104RM through the WL 140; along the third row of the memory array 104A, the memory bit cells 104-9 to 104-12 are coupled to a third component 104RM-3 of the row selection circuit 104RM through the WL 142; and along the fourth row of the memory array 104A, the memory bit cells 104-13 to 104-16 are coupled to a fourth component 104RM-4 of the row selection circuit 104RM through the WL 144. In some embodiments, each of the components 104RM-1 to 104RM-4 may be implemented by any of a variety of pass gate transistors known in the art that are configured to allow a signal to pass therethrough based on a control signal such as, for example, a gated latch, a transmission gate, etc.

Along the first column of the memory array 104A, the memory bit cells 104-1, 104-5, 104-9, and 104-13 are coupled to a first component 104CM-1 of the column selection circuit 104CM through the BL 130; along the second column of the memory array 104A, the memory bit cells 104-2, 104-6, 104-10, and 104-14 are coupled to a second component 104CM-2 of the column selection circuit 104CM through the BL 132; along the third column of the memory array 104A, the memory bit cells 104-3, 104-7, 104-11, and 104-15 are coupled to a third component 104CM-3 of the column selection circuit 104CM through the BL 134; and along the fourth column of the memory array 104A, the memory bit cells 104-4, 104-8, 104-12, and 104-16 are coupled to a fourth component 104CM-4 of the column selection circuit 104CM through the BL 136. Similarly, in some embodiments, each of the components 104CM-1 to 104CM-4 may be implemented by any of a variety of pass gate transistors that are configured to allow a signal to pass therethrough based on a control signal such as, for example, a gated latch, a transmission gate, etc.

Along the column direction, the memory bit cells are further coupled to the write driver circuit 104WD through the respective BL. For example, along the first column of the memory array 104A, the memory bit cells 104-1, 104-5, 104-9, and 104-13 are coupled to the write driver circuit 104WD through the BL 130; along the second column of the memory array 104A, the memory bit cells 104-2, 104-6, 104-10, and 104-14 are coupled to the write driver circuit 104WD through the BL 132; along the third column of the memory array 104A, the memory bit cells 104-3, 104-7, 104-11, and 104-15 are coupled to the write driver circuit 104WD through the BL 134; and along the fourth column of the memory array 104A, the memory bit cells 104-4, 104-8, 104-12, and 104-16 are coupled to the write driver circuit 104WD through the BL 136. In some embodiments, the write driver circuit 104WD may be implemented by a combination of plural logic gates and/or transistors known in the art that is configured to provide a write signal (e.g., a voltage signal) to an asserted BL.

Similar as the configuration of the memory bank 102, the memory bank 106 includes memory bit cells 106-1, 106-2, 106-3, 106-4, 106-5, 106-6, 106-7, 106-8, 106-9, 106-10, 106-11, 106-12, 106-13, 106-14, 106-15, and 106-16, formed as an array 106A, that are each disposed at an intersection of a BL and WL, e.g., one of BL's 146, 148, 150, and 152 and one of WL's 154, 156, 158, and 160, a row selection circuit 106RM, a column selection circuit 106CM, and a write driver circuit 106WD. Further, the row selection circuit 106RM also includes four components 106RM-1, 106RM-2, 106RM-3, and 106RM-4 that are each coupled to respective memory bit cells of the memory array 106A through a corresponding WL; and the column selection circuit 106CM also includes four components 106CM-1, 106CM-2, 106CM-3, and 106CM-4 that are each coupled to respective memory bit cells of the memory array 106A through a corresponding BL. The row selection circuit 106RM and column selection circuit 106CM, and write driver circuit 106WD are substantially similar to the above-described row selection circuit 104RM, column selection circuit 104CM, and write driver circuit 104WD, respectively, such that descriptions of the row selection circuit 106RM, column selection circuit 106CM, and write driver circuit 106WD are not repeated again.

Referring to FIG. 2B, the memory banks 108 and 110 are each substantially similar to the memory banks 104 and 106 (FIG. 2A). Thus, the memory banks 108 and 110 are briefly described as follows. For example, the memory bank 108 includes memory bit cells 108-1, 108-2, 108-3, 108-4, 108-5, 108-6, 108-7, 108-8, 108-9, 108-10, 108-11, 108-12, 108-13, 108-14, 108-15, and 108-16, formed as an array 108A, that are each disposed at an intersection of a BL and WL, e.g., one of BL's 162, 164, 166, and 168 and one of WL's 170, 172, 174, and 176, a row selection circuit 108RM, a column selection circuit 108CM, and a write driver circuit 108WD; and the memory array 110 includes memory bit cells 110-1, 110-2, 110-3, 110-4, 110-5, 110-6, 110-7, 110-8, 110-9, 110-10, 110-11, 110-12, 110-13, 110-14, 110-15, and 110-16, formed as an array 110A, that are each disposed at an intersection of a BL and WL, e.g., one of BL's 178, 180, 182, and 184 and one of WL's 186, 188, 190, and 192. Further, in the memory bank 108, the row selection circuit 108RM also includes four components 108RM-1, 108RM-2, 108RM-3, and 108RM-4 that are each substantially similar to the above-described components of the row selection circuit 104RM (FIG. 2A); and the column selection circuit 108CM also includes four components 108CM-1, 108CM-2, 108CM-3, and 108CM-4 that are each substantially similar to the above-described components of the column selection circuit 104CM (FIG. 2A). In the memory bank 110, the row selection circuit 110RM also includes four components 110RM-1, 110RM-2, 110RM-3, and 110RM-4 that are each substantially similar to the above-described components of the row selection circuit 104RM (FIG. 2A); and the column selection circuit 110CM also includes four components 110CM-1, 110CM-2, 110CM-3, and 110CM-4 that are each substantially similar to the above-described components of the column selection circuit 104CM (FIG. 2A).

As mentioned above, each component of the row selection circuits 104RM, 106RM, 108RM, and 110RM is configured to allow a signal to pass therethrough based on a control signal, in accordance with some embodiments. More specifically, each component of the row selection circuits 104RM, 106RM, 108RM, and 110RM is configured to assert at least one of the coupled WL's by allowing the signal to pass therethrough based on address information indicated by the control signal that is provided by the control logic circuit 102. Similarly, each component of the column selection circuits 104CM, 106CM, 108CM, and 110CM is configured to assert at least one of the coupled BL's also based on the above-mentioned address information.

In some embodiments, such address information may include which of the WL's 138 to 144, 154 to 160, 170 to 176, and 186 to 192 and which of the BL's 130 to 136, 146 to 152, 162 to 168, and 178 to 184 to be asserted, respectively. Accordingly, the row selection circuit 104RM may assert one of the WL's 138 to 144 to allow the memory bit cells of the memory array 104A that are disposed along the asserted WL to be accessed (e.g., read or written) by activating the corresponding component (e.g., one of the components 104RM-1 to 104RM-4); the row selection circuit 106RM may assert one of the WL's 154 to 160 to allow the memory bit cells of the memory array 106A that are disposed along the asserted WL to be accessed (e.g., read or written) by activating the corresponding component (e.g., one of the components 106RM-1 to 106RM-4); the row selection circuit 108RM may assert one of the WL's 170 to 176 to allow the memory bit cells of the memory array 108A that are disposed along the asserted WL to be accessed (e.g., read or written) by activating the corresponding component (e.g., one of the components 108RM-1 to 108RM-4); and the row selection circuit 110RM may assert one of the WL's 186 to 192 to allow the memory bit cells of the memory array 110A that are disposed along the asserted WL to be accessed (e.g., read or written) by activating the corresponding component (e.g., one of the components 110RM-1 to 110RM-4).

And, the column selection circuit 104CM may assert one of the BL's 130 to 136 to allow the memory bit cells of the memory array 104A that are disposed along the asserted BL to be accessed (e.g., read or written) by activating the corresponding component (e.g., one of the components 104CM-1 to 104CM-4); the column selection circuit 106CM may assert one of the BL's 146 to 152 to allow the memory bit cells of the memory array 106A that are disposed along the asserted BL to be accessed (e.g., read or written) by activating the corresponding component (e.g., one of the components 106CM-1 to 106CM-4); the column selection circuit 108CM may assert one of the BL's 162 to 168 to allow the memory bit cells of the memory array 108A that are disposed along the asserted BL to be accessed (e.g., read or written) by activating the corresponding component (e.g., one of the components 108CM-1 to 108CM-4); and the column selection circuit 110RM may assert one of the BL's 178 to 184 to allow the memory bit cells of the memory array 110A that are disposed along the asserted BL to be accessed (e.g., read or written) by activating the corresponding component (e.g., one of the components 110CM-1 to 110CM-4).

Figure 3:
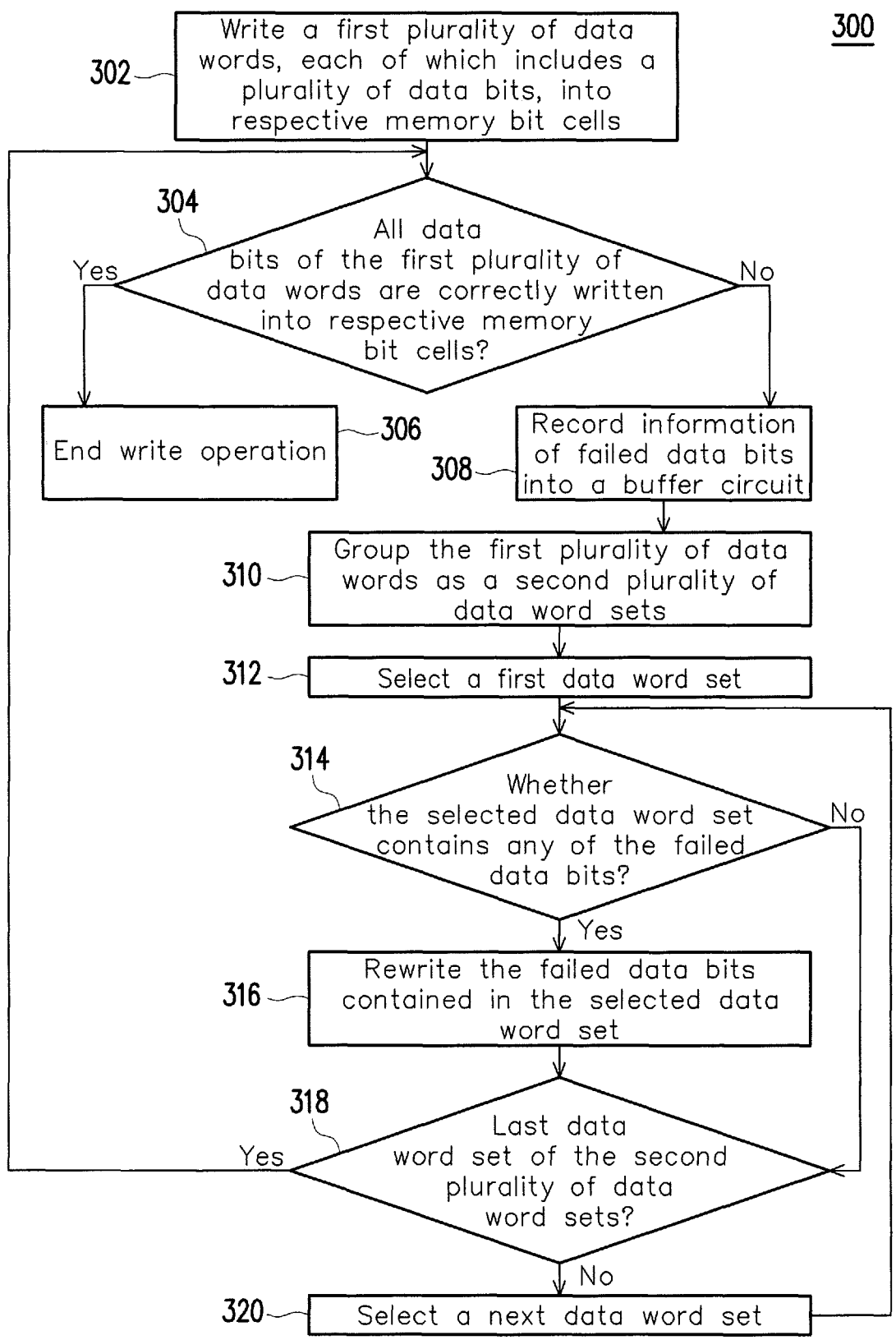
FIG. 3 illustrates a flow chart of an exemplary method to operate the memory device of FIG. 1, in accordance with various embodiments.

FIG. 3 illustrates a flow chart of an exemplary method to rewrite one or more failed data bits into respectively configured memory bit cells based on a unit of data word group, in accordance with various embodiments. In various embodiments, the operations of the method 300 are performed by the respective components illustrated in FIGS. 1-2B. For purposes of discussion, the following embodiment of the method 300 will be described in conjunction with FIGS. 1-2B. The illustrated embodiment of the method 300 is merely an example. Therefore, it should be understood that any of a variety of operations may be omitted, re-sequenced, and/or added while remaining within the scope of the present disclosure.

The method 300 starts with operation 302 in which a first plurality of data words, each of which includes a plurality of data bits, are written into respective memory bit cells. In some embodiments, the respective numbers of the data bits of the data words may be equal to or different from each other.

For example, the control logic circuit 102 may receive 5 data words: $1^{st}$ data word, $2^{nd}$ data word, $3^{rd}$ data word, $4^{th}$ data word, $5^{th}$ data word, each of which has plural data bits (e.g., 4 data bits for purposes of simplicity). Further, as mentioned above, when the control logic circuit 102 receives the 5 data words, each of the data bits of the 5 data words may be associated with a corresponding logical address that can be mapped to a physical address (i.e., at which intersection of a BL and WL) of one the memory bit cells of the memory arrays 104A-110A. The control logic circuit 102 then writes the data bits of the 5 data words into the memory bit cells using the respective logical addresses.

More specifically, the 4 data bits of the $1^{st}$ data word may be respectively configured to be written into the memory bit cells 104-1, 104-2, 104-3, and 104-4 of the memory array 104A (as indicated in FIG. 2A); the 4 data bits of the $2^{nd}$ data word may be respectively configured to be written into the memory bit cells 108-5, 108-6, 108-7, and 108-8 of the memory array 108A (as indicated in FIG. 2B); the 4 data bits of the $3^{rd}$ data word may be respectively configured to be written into the memory bit cells 108-9, 108-10, 108-11, and 108-12 of the memory array 108A (as indicated in FIG. 2B); the 4 data bits of the $4^{th}$ data word may be respectively configured to be written into the memory bit cells 110-9, 110-10, 110-11, and 110-12 of the memory array 110 (as indicated in FIG. 2B); the 4 data bits of the $5^{th}$ data word may be respectively configured to be written into the memory bit cells 110-13, 110-14, 110-15, and 110-16 of the memory array 110 (as indicated in FIG. 2B).

Accordingly, the control logic circuit 102 may cause the row selection circuit 104RM to activate the component 104RM-1 so as to assert the WL 138, and cause the column selection circuit 104CM to respectively or collectively activate the components 104CM-1 to 104CM-4 so as to assert the BL's 130 to 136 such that the data bits of the $1^{st}$ data word can be written into the memory bit cells 104-1 to 104-4, respectively. Similarly, the control logic circuit 102 may cause the row selection circuit 108RM to activate the component 108RM-2 so as to assert the WL 172, and cause the column selection circuit 108CM to respectively or collectively activate the components 108CM-1 to 108CM-4 so as to assert the BL's 162 to 168 such that the data bits of the $2^{nd}$ data word can be written into the memory bit cells 108-5 to 108-8, respectively; the control logic circuit 102 may cause the row selection circuit 108RM to activate the component 108RM-3 so as to assert the WL 174, and cause the column selection circuit 108CM to respectively or collectively activate the components 108CM-1 to 108CM-4 so as to assert the BL's 162 to 168 such that the data bits of the $3^{rd}$ data word can be written into the memory bit cells 108-9 to 108-12, respectively; the control logic circuit 102 may cause the row selection circuit 110RM to activate the component 110RM-3 so as to assert the WL 190, and cause the column selection circuit 110CM to respectively or collectively activate the components 110CM-1 to 110CM-4 so as to assert the BL's 178 to 184 such that the data bits of the $4^{th}$ data word can be written into the memory bit cells 110-9 to 110-12, respectively; the control logic circuit 102 may cause the row selection circuit 110RM to activate the component 110RM-4 so as to assert the WL 192, and cause the column selection circuit 110CM to respectively or collectively activate the components 110CM-1 to 110CM-4 so as to assert the BL's 178 to 184 such that the data bits of the $5^{th}$ data word can be written into the memory bit cells 110-13 to 110-16, respectively.

The method 300 continues to operation 304 to determine whether all the data bits of the first plurality of data words are correctly written into the respective memory bit cells. Continuing with the above example, subsequently to writing all the data bits of the $1^{st}$ to $5^{th}$ data words into the respective configured memory bit cells, the control logic circuit 102 may follow the same operations as described above to assert the respective WL's and BL's of the memory bit cells that are written with the $1^{st}$ to $5^{th}$ data words, and use one or more coupled sensing amplifiers (not shown) to read out the written data bits. Further, in some embodiments, the control logic circuit 102 may compare the respective logical states of the data bits of the $1^{st}$ to $5^{th}$ data words that the control logic circuit 102 intends to write into the memory bit cells (i.e., the respective logical states of the data bits of the $1^{st}$ to $5^{th}$ data words that the control logic circuit 102 received in operation 302) with the logical states read out from the memory bit cells. In some embodiments, when all the read-out logical states of the data bits of the $1^{st}$ to $5^{th}$ data words match the respective intended logical states (i.e., all the data bits of the first plurality of data words are correctly written into the respective memory bit cells), the method 300 proceeds to operation 306 in which the write operation ends.

On the other hand, when the read-out logical states of one or more of the data bits of the $1^{st}$ to $5^{th}$ data words do not match the respective intended logical states, such data bits may be categorized, by the control logic circuit 102, as failed data bits, as mentioned above. In this case (i.e., not all the data bits of the first plurality of data words are correctly written into the respective memory bit cells), the method 300 proceeds to operation 308 in which information of such failed data bits are recorded into a buffer circuit. In some embodiments, the aforementioned information of failed data bits may include which of the data words each failed data bit belongs to and a mapping of such failed data bits. The mapping may include where (i.e., which physical address) each of the failed data bits is configured to be written.

Continuing with the above example, after performing the comparison in operation 304, the control logic circuit 102 may determine that the $3^{rd}$ data bit of the $1^{st}$ data word, the $3^{rd}$ data bit of the $2^{nd}$ data word, the $3^{rd}$ data bit of the $3^{rd}$ data word, and the $1^{st}$ data bit of the $4^{th}$ data word are failed data bits. In other words, except for the $5^{th}$ data word, each data word has one failed data bit, accordingly, the control logic circuit 102 records such information indicating which of the 5 data words has failed data bits into the buffer circuit 120. Subsequently to or simultaneously with identifying the failed data bits, the control logic circuit 102 may further record the respective physical addresses of memory bit cells where the failed data bits were written into the buffer circuit 120. For example, the control logic circuit 102 may record the $3^{rd}$ data bit of the $1^{st}$ data word was written to the memory bit cell 104-3 located at the intersection of the third column (BL 134) and first row (WL 138) of the memory array 104A; the $3^{rd}$ data bit of the $2^{nd}$ data word was written to the memory bit cell 108-7 at the intersection of the third column (BL 166) and second row (WL 172) of the memory array 108A; the $3^{rd}$ data bit of the $3^{rd}$ data word was written to the memory bit cell 108-11 at the intersection of the third column (BL 166) and third row (WL 174) of the memory array 108A; and the $1^{st}$ data bit of the $4^{th}$ data word was written to the memory bit cell 110-9 at the intersection of the first column (BL 178) and third row (WL 190) of the memory array 110A.

Referring again to FIG. 3, after determining not all the data bits of the first plurality of data words are correctly written into the respective memory bit cells and recording respective information of the failed data bits (operations 304 and 308), the method 300 continues to operation 310 in which the first plurality of data words are grouped as a second plurality of data word sets. If the number of the first plurality of data words can be divided by the size with no remainder, each data word set may have an equally divided number of data words. On the other hand, if the number of the first plurality of data words cannot be divided by the size with no remainder, every data word set, except for a last word set, may have an equally divided number of data words.

Continuing with the above example, the control logic circuit 102 may determine the size of the data word set as 2, which reflects the latter case discussed above. As such, the control logic circuit 102 may group the $1^{st}$ and $2^{nd}$ data words as a first data word set; the $3^{rd}$ and $4^{th}$ data words as a second data word set; and the $5^{th}$ data word as a third word set. In some embodiments, the control logic circuit 102 may rewrite the failed data bits in each data word set following the respective orders, i.e., rewriting the first data word set, the second data word set, and then the third data word set, which will be discussed in further detail below. As such, the third data word set may be regarded as the last data word set of the plural data word sets. However, it is understood that the control logic circuit 102 may not follow the orders to rewrite the failed data bits while remaining within the scope of the present disclosure.

In some alternative embodiments, upon determining the size of the data word set, the control logic circuit 102 may group the data words that have failed data bits as a same, or first, data word set, and prioritize to rewrite the failed data bits contained in such a first data word set. In an example where among $1^{st}$ to $5^{th}$ data words, only the $1^{st}$ and $4^{th}$ data words have failed data bits, the control logic circuit 102 may group the $1^{st}$ and $4^{th}$ data words as a first data word set; the $2^{nd}$ and $3^{rd}$ data words, which do not have any failed data bits, as a second data word set; and the $5^{th}$ data word, which does not have any failed data bits, as a third data word set. And, the control logic circuit 102 may prioritize to rewrite the failed data bits contained in the first data word set.

The method 300 continues to operation 312 in which a first data word set is selected. In some embodiments, after grouping the first plurality of data words, the control logic circuit 102 may first select a data word set by its order, as mentioned above. In the above example, the control logic circuit 102 may select the first data word set that includes the $1^{st}$ and $2^{nd}$ data words.

The method 300 continues to operation 314 to determine whether the selected data word set contains any of the failed data bits. Continuing with the above example, the control logic circuit 102 may determine whether the selected data word set (e.g., the first data word set that includes the $1^{st}$ and $2^{nd}$ data words) by accessing the buffer circuit 120 since in operation 308, the control logic circuit 102 stores the information of all the failed data bits in the buffer circuit 120.

According to some embodiments, in determination operation 314, if the selected data word set contains one or more of the failed data bits, the method 300 proceeds to operation 316 in which the failed data bit(s) contained in the selected data word set are respectively rewritten into the respective configured memory bit cells, and then to operation 318 to further determine whether the selected data word set is the last data word set of the second plurality of data word sets. If the selected data word set is the last one of the second plurality of data word sets, the method 300 proceeds again to operation 304 to determine whether all the data bits of the first plurality of data words are correctly written into the respective memory bit cells. Or, if the selected data word set is not the last one of the second plurality of data word sets, the method 300 proceeds to operation 320 in which a next data word set is selected, and then loops back to operation 314.

On the other hand, in determination operation 314, if the selected data word set contains none of the failed data bits, the method 300 skips operation 316 and directly proceeds to operation 318 to further determine whether the selected data word set is the last data word set of the second plurality of data word sets. Similarly, if the selected data word set is the last one of the second plurality of data word sets, the method 300 proceeds again to operation 304 to determine whether all the data bits of the first plurality of data words are correctly written into the respective memory bit cells. Or, if the selected data word set is not the last one of the second plurality of data word sets, the method 300 proceeds to operation 320 in which a next data word set is selected, and then loops back to operation 314.

As such, one or more iteration loops may be formed while performing the method 300, for example, a first iteration loop starting from operation 314, going through operations 316, 318, and 320, and returning to operation 314, a second iteration loop starting from operation 314, going through operations 316, 318, 304, 308, 310, and 312, and returning to operation 314, a third iteration loop starting from operation 314, going through operations 318 and 320, and returning to operation 314, and a fourth iteration loop starting from operation 314, going through operations 318, 304, 308, 310, and 312, and returning to operation 314. Operations 316, 318, and 320 will be respectively described in further detail below.

In the above example in which the first data word set including the $1^{st}$ and $2^{nd}$ data words is selected (operation 312), since both the $1^{st}$ and $2^{nd}$ data words have at least one of the failed data bits (operation 314), in operation 316, the control logic circuit 102 may concurrently rewrite the failed data bits, which were respectively included in the $1^{st}$ and $2^{nd}$ data words but are now grouped together in the first data word set, to respective configured memory bit cells, in accordance with some embodiments. More specifically, the $1^{st}$ data word has one failed data bit that was written to the memory bit cell 104-3 of the memory array 104A, and the $2^{nd}$ data word has one failed data bit that was written to the memory bit cell 108-4 of the memory array 108. In some embodiments, the control logic circuit 102 may concurrently assert the WL 138 by activating the component 104RM-1 to allow the access of the memory bit cell 104-3, and the WL 172 by activating the component 108RM-2 to allow the access of the memory bit cell 108-7. Concurrently or subsequently, the control logic circuit 102 asserts the BL 134 by activating the component 104CM-3 to cause the write driver circuit 104WD to rewrite the intended logical state of the $3^{rd}$ data bit of the $1^{st}$ data word to the memory bit cell 104-3, and the BL 166 by activating the component 108CM-3 to cause the write driver circuit 108WD to rewrite the intended logical state of the $3^{rd}$ data bit of the $3^{rd}$ data word to the memory bit cell 108-7.

In operation 318, the control logic circuit 102 checks whether the selected first data word set including the $1^{st}$ and $2^{nd}$ data words is the last one of the plural data word sets. In the current example, the last data word set should be the third data word set that includes the $5^{th}$ data word, so the method 300 proceed to operation 320 to select a next data word set, which is the second data word set that includes the $3^{rd}$ and $4^{th}$ data words. The method 300 then loops back to operation 314 to determine whether the second data word set include any of the failed data bits. Since the both the $3^{rd}$ and $4^{th}$ data words have at least one of the failed data bits (as described above), the control logic circuit 102 may follow the principle described above to concurrently rewrite the failed data bits, which were respectively included in the $3^{rd}$ and $4^{th}$ data words but are now grouped together in the second data word set, to respective configured memory bit cells 108-11 and 110-9, and checks whether the selected second data word set including the $3^{rd}$ and $4^{th}$ data words is the last one of the plural data word sets. In the current example, the second data word set is still not the last data word set so the method 300 proceed to operation 320 to select a next data word set, the third data word set that includes the $5^{th}$ data word, and then loops back to operation 314. Since the third data word set does not contain any failed data bit, the method 300 directly proceeds to operation 318, and since the third data word set is the last data word set (as determined in operation 318), the method 300 then proceeds again to operation 304 to determine whether all the data bits of the $1^{st}$ to $5^{th}$ data words are correctly written into the respective configured memory bit cells. Similarly, if all the data bits of the $1^{st}$ to $5^{th}$ data words are correctly written into the respective configured memory bit cells, the write operation ends (operation 306); and if there is still one or more failed data bits, such failed data bits will be rewritten following operation 308-312, and selectively following the iteration loop of operations 314, 316, 318, 320, and 314, the iteration loop of operations 314, 318, 320, and 314, or the iteration loop of operations 314, 316, 318, 304, 308, 310, 312, and 314.

Figure 4:
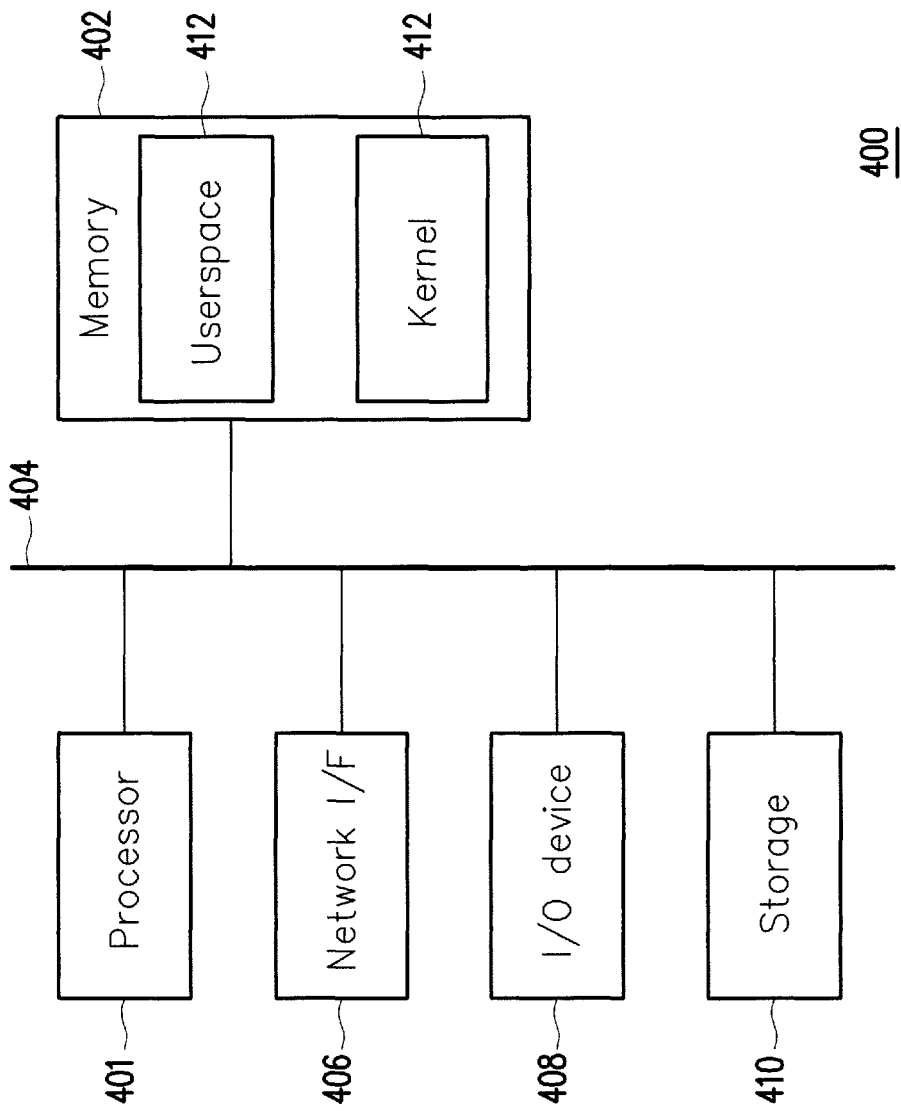
FIG. 4 illustrates a block diagram of a computer system to perform the method of FIG. 3, in accordance with some embodiments.

FIG. 4 is a block diagram of a computer system 400 in accordance with some embodiments. One or more of the circuits and/or engines and/or systems and/or operations described with respect to FIGS. 1-3 is realized in some embodiments by one or more computer systems 400 of FIG. 4. The system 400 comprises at least one processor 401, a memory 402, a network interface (I/F) 406, an input/output (I/O) device 408, and a storage 410 communicatively coupled via a bus 404 or other interconnection communication mechanism.

The memory 402 comprises, in some embodiments, a random access memory (RAM) and/or other dynamic storage device and/or read only memory (ROM) and/or other static storage device, coupled to the bus 404 for storing data and/or instructions to be executed by the processor 401. The memory 402 can further include a userspace 412, kernel 414, portions of the kernel and/or the userspace, and components thereof. The memory 402 is also used, in some embodiments, for storing temporary variables or other intermediate information during execution of instructions to be executed by the processor 401. In various embodiments, the memory 402 can be contained within a single integrated circuit or comprise a plurality of discrete memory devices operatively coupled to one another.

In some embodiments, a storage device 410, such as a magnetic disk or optical disk, is coupled to the bus 404 for storing data and/or instructions. The I/O device 408 comprises an input device, an output device and/or a combined input/output device for enabling user interaction with the system 400. An input device comprises, for example, a keyboard, keypad, mouse, trackball, trackpad, and/or cursor direction keys for communicating information and commands to the processor 401. An output device comprises, for example, a display, a printer, a voice synthesizer, etc. for communicating information to a user.

In some embodiments, one or more operations and/or functionality of the circuits and/or engines and/or systems described with respect to FIGS. 1-3 are realized by the processor 401, which is programmed for performing such operations and/or functionality. In some embodiments, the processor 401 is configured as specifically configured hardware (e.g., one or more application specific integrated circuits (ASICs)). In accordance with various embodiments, the processor 401 may be implemented within a single integrated circuit (IC) or as multiple communicatively coupled IC's and/or discrete circuits. It is appreciated that the processor 401 can be implemented in accordance with various known technologies. In one embodiment, the processor 401 includes one or more circuits or units configurable to perform one or more functions or processes described herein by executing instructions stored in an associated memory, for example. In other embodiments, the processor 401 may be implemented as firmware (e.g., discrete logic components) configured to perform one or more functions or processes described herein. For example, in accordance with various embodiments, the processor 401 may include one or more controllers, microprocessors, microcontrollers, application specific integrated circuits (ASICs), digital signal processors, programmable logic devices, field programmable gate arrays, or any combination of these devices or structures, or other known devices and structures, to perform the functions described herein.

One or more of the memory 402, the I/F 406, the storage 410, the I/O device 408, and the bus 404 is/are operable to receive instructions, data, design constraints, design rules, netlists, layouts, models and/or other parameters for processing by the processor 401.

In some embodiments, the operations and/or functionality are realized as functions of a program stored in a non-transitory computer readable recording medium. In at least one embodiment, the operations and/or functionality are realized as functions of a program, such as a set of executable instructions, stored in memory 402. In at least one embodiment, an IC design is stored in a non-transitory computer readable recording medium for access by one or more operations as described herein. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In an embodiment, a method includes: writing a plurality of data words, each of which has a plurality of data bits, into respective bit cells of a memory device; in response to determining that not all the data bits of the plurality of data words are correctly written into the respective bit cells of the memory device, grouping the plurality of data words as a plurality of data word sets; and simultaneously rewriting a subset of data bits that were not correctly written into the respective bit cells of the memory device, wherein the subset of the data bits are contained in a respective one of the plurality of data word sets.

In another embodiment, a method includes: writing a plurality of data words, each of which has a plurality of data bits, into respective bit cells of a memory device; verifying whether all the data bits of the plurality of data words are correctly written into the respective bit cells of the memory device; in response to a presence of one or more data bits of the plurality of data words that are not correctly written into the respective bit cells of the memory device, grouping the plurality of data words as a plurality of data word sets; and iteratively rewriting at least one of the one or more data bits that is contained in a respective one of the plurality of data word sets into the respective bit cell of the memory device until all the data bits of the plurality of data words are verified to be correctly written into the respective bit cells of the memory device.

In yet another embodiment, a memory device includes: a plurality of memory bit cells; and a control logic circuit, coupled to the plurality of memory bit cells. The control logic circuit is configured to: write a plurality of data words, each of which has a plurality of data bits, into respective ones of the plurality of memory bit cells; verify whether all the data bits of the plurality of data words are correctly written into the respective memory bit cells; in response to a presence of one or more data bits of the plurality of data words that are not correctly written into the respective memory bit cells, group the plurality of data words as a plurality of data word sets; and iteratively rewrite at least one of the one or more data bits that is contained in a respective one of the plurality of data word sets into the respective memory bit cell until all the data bits of the plurality of data words are verified to be correctly written into the respective memory bit cells.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   writing a plurality of data words, each of which has a plurality of data bits, into respective bit cells of a memory device;
   in response to determining that not all the data bits of the plurality of data words are correctly written into the respective bit cells of the memory device, grouping the plurality of data words as a plurality of data word sets; and
   simultaneously rewriting a subset of data bits that were not correctly written into the respective bit cells of the memory device, wherein the subset of the data bits are contained in a respective one of the plurality of data word sets.

2. The method of claim 1, wherein at least a subset of the plurality of data word sets have a common number of data words.

3. The method of claim 1, wherein at least a subset of the plurality of data word sets have respective different numbers of data words.

4. The method of claim 1, further comprising:
   storing respective addresses associated with the data bits that were not correctly written into the respective bit cells of the memory device into one or more buffers of the memory device.

5. The method of claim 4, further comprising:
   accessing the one or more buffers to determine whether a first one of the plurality of data word sets includes any of the data bits that were not correctly written into the respective bit cells of the memory device.

6. The method of claim 5, further comprising:
   in response to the first one of the plurality of data word sets including a first subset of the data bits that were not correctly written into the respective bit cells into the respective bit cells of the memory device, rewriting the first subset of the data bits into the respective bit cell of the memory device and then determining whether the first one of the plurality of data word sets is a last one of the plurality of data word sets; and
   in response to the first one of the plurality of data word sets including none of the data bits that were not correctly written into the respective bit cells into the respective bit cells of the memory device, determining whether the first one of the plurality of data word sets is the last one of the plurality of data word sets.

7. The method of claim 6, further comprising:
   in response to the first one of the plurality of data word sets not being the last one of the plurality of data word sets, determining whether a second one of the plurality of data word sets includes any of the data bits that were not correctly written into the respective bit cells into the respective bit cells of the memory device, and in response, selectively rewriting a second subset of the data bits that contained in the second one of the plurality of data word sets into the respective bit cell of the memory device; and
   in response to the first one of the plurality of data word sets being the last one of the plurality of data word sets, verifying whether all the data bits of the plurality of data words are correctly written into the respective bit cells of the memory device.

8. A method, comprising:
   writing a plurality of data words, each of which has a plurality of data bits, into respective bit cells of a memory device;
   verifying whether all the data bits of the plurality of data words are correctly written into the respective bit cells of the memory device;
   in response to a presence of one or more data bits of the plurality of data words that are not correctly written into the respective bit cells of the memory device, grouping the plurality of data words as a plurality of data word sets; and
   iteratively rewriting at least one of the one or more data bits that is contained in a respective one of the plurality of data word sets into the respective bit cell of the memory device until all the data bits of the plurality of data words are verified to be correctly written into the respective bit cells of the memory device.

9. The method of claim 8, wherein at least a subset of the plurality of data word sets have a common number of data words.

10. The method of claim 8, wherein at least a subset of the plurality of data word sets have respective different numbers of data words.

11. The method of claim 8, further comprising:
storing respective addresses associated with the one or more data bits that were not correctly written into the respective bit cells into the respective bit cells of the memory device into one or more buffers of the memory device.

12. The method of claim 11, further comprising:
accessing the one or more buffers to determine whether a first one of the plurality of data word sets includes any of the one or more data bits that were not correctly written into the respective bit cells into the respective bit cells of the memory device.

13. The method of claim 12, further comprising:
when the first one of the plurality of data word sets includes at least a first one of the one or more data bits that were not correctly written into the respective bit cells into the respective bit cells of the memory device, rewriting the at least first one of the one or more data bits into the respective bit cell of the memory device; and
determining whether the first one of the plurality of data word sets is a last one of the plurality of data word sets.

14. The method of claim 13, further comprising:
when the first one of the plurality of data word sets is not the last one of the plurality of data word sets, iteratively determining whether a next one of the plurality of data word sets includes any of the one or more data bits that were not correctly written into the respective bit cells into the respective bit cells of the memory device and in response, selectively rewriting at least one of the one or more data bits contained in the next one of the plurality of data word sets into the respective bit cell of the memory device until the next one of the plurality of data word sets is the last one of the plurality of data word sets; and
verifying again whether all the data bits of the plurality of data words are correctly written into the respective bit cells of the memory device.

15. The method of claim 14, further comprising:
when the first one of the plurality of data word sets is not the last one of the plurality of data word sets, iteratively determining whether a next one of the plurality of data word sets includes any of the one or more data bits that were not correctly written into the respective bit cells into the respective bit cells of the memory device and in response, selectively rewriting at least one of the one or more data bits contained in the next one of the plurality of data word sets into the respective bit cell of the memory device until the next one of the plurality of data word sets is the last one of the plurality of data word sets; and
verifying again whether all the data bits of the plurality of data words are correctly written into the respective bit cells of the memory device.

16. A memory device, comprising:
a plurality of memory bit cells; and
a control logic circuit, coupled to the plurality of memory bit cells, and configured to:
write a plurality of data words, each of which has a plurality of data bits, into respective ones of the plurality of memory bit cells;
verify whether all the data bits of the plurality of data words are correctly written into the respective memory bit cells;
in response to a presence of one or more data bits of the plurality of data words that are not correctly written into the respective memory bit cells, group the plurality of data words as a plurality of data word sets; and
iteratively rewrite at least one of the one or more data bits that is contained in a respective one of the plurality of data word sets into the respective memory bit cell until all the data bits of the plurality of data words are verified to be correctly written into the respective memory bit cells.

17. The memory device of claim 16, wherein the control logic circuit is further configured to: determine whether a first one of the plurality of data word sets includes any of the one or more data bits that were not correctly written into the respective memory bit cells.

18. The memory device of claim 17, wherein when the first one of the plurality of data word sets includes at least a first one of the one or more data bits that were not correctly written into the respective memory bit cells, the control logic circuit is further configured to:
rewrite the at least first one of the one or more data bits into the respective memory bit cell; and
determine whether the first one of the plurality of data word sets is a last one of the plurality of data word sets.

19. The memory device of claim 18, wherein when the first one of the plurality of data word sets is not the last one of the plurality of data word sets, the control logic circuit is further configured to:
iteratively determine whether a next one of the plurality of data word sets includes any of the one or more data bits that were not correctly written into the respective memory bit cells and in response, selectively rewrite at least one of the one or more data bits contained in the next one of the plurality of data word sets into the respective memory bit cell until the next one of the plurality of data word sets is the last one of the plurality of data word sets; and
verify again whether all the data bits of the plurality of data words are correctly written into the respective memory bit cells.

20. The memory device of claim 17, wherein when the first one of the plurality of data word sets does include any of the one or more data bits that were not correctly written into the respective memory bit cells, the control logic circuit is further configured to:
determine whether the first one of the plurality of data word sets is a last one of the plurality of data word sets, when the first one of the plurality of data word sets is not the last one of the plurality of data word sets, iteratively determine whether a next one of the plurality of data word sets includes any of the one or more data bits that were not correctly written into the respective memory bit cells, in response, selectively rewrite at least one of the one or more data bits contained in the next one of the plurality of data word sets into the respective memory bit cell until the next one of the plurality of data word sets is the last one of the plurality of data word sets, and verify again whether all the data bits of the plurality of data words are correctly written into the respective memory bit cells.

* * * * *